United States Patent
Badahdah et al.

(10) Patent No.: US 11,075,310 B2
(45) Date of Patent: *Jul. 27, 2021

(54) SECONDARY OPTIC FOR CONCENTRATING PHOTOVOLTAIC DEVICE

(71) Applicants: INTERNATIONAL BUSINESS MACHINES CORPORATION, Armonk, NY (US); King Abdulaziz City for Science and Technology, Riyadh (SA)

(72) Inventors: Alhassan Badahdah, Jeddah (SA); Hussam Khonkar, Riyadh (SA); Yves C. Martin, Ossining, NY (US); Theodore G. Van Kessel, Millbrook, NY (US)

(73) Assignees: International Business Machines Corporation, Armonk, NY (US); King Abdulaziz City for Science and Technology, Riyadh (SA)

( * ) Notice: Subject to any disclaimer, the term of this patent is extended or adjusted under 35 U.S.C. 154(b) by 808 days.

This patent is subject to a terminal disclaimer.

(21) Appl. No.: 15/130,490

(22) Filed: Apr. 15, 2016

(65) Prior Publication Data
US 2016/0233350 A1    Aug. 11, 2016

Related U.S. Application Data

(63) Continuation of application No. 13/711,158, filed on Dec. 11, 2012, now Pat. No. 9,318,636.

(51) Int. Cl.
H01L 31/0232    (2014.01)
H01L 31/054     (2014.01)
(Continued)

(52) U.S. Cl.
CPC .... *H01L 31/02325* (2013.01); *H01L 31/0543* (2014.12); *H01L 31/0547* (2014.12);
(Continued)

(58) Field of Classification Search
CPC  H01L 31/02325; H01L 31/18; H01L 31/0547
See application file for complete search history.

(56) References Cited

U.S. PATENT DOCUMENTS 4,830,678 A    5/1989  Todorof et al.
6,620,995 B2   9/2003  Vasylyev et al.
(Continued)

FOREIGN PATENT DOCUMENTS

WO    WO2010059657 A2    5/2010

OTHER PUBLICATIONS

Esparza, E., et al. "Solar Concentrator With Diffuser Segments" SPIE Proceedings vol. 8011—22nd Congress of the International Commission for Optics: Light for the Development of the World. Oct. 2011. pp. 1-6.
(Continued)

*Primary Examiner* — Golam Mowla
(74) *Attorney, Agent, or Firm* — Tutunjian & Bitetto, P.C.; Jeffrey S. La Baw

(57) ABSTRACT

A light concentrating optic for use with a photovoltaic device includes a light pipe having a first end portion for receiving light and a second end portion for outputting concentrated light. An optical element is coupled to the light pipe on the first end portion and configured to form an optical interface between the light pipe and the optical element. The optical element includes at least one light transmitting surface configured to redirect incident light entering the optical element to disperse the light to fall incident on side walls of the light pipe to increase homogeneity and intensity of light through the second end portion.

13 Claims, 5 Drawing Sheets

(51) Int. Cl.
*H01L 31/18* (2006.01)
*G02B 6/42* (2006.01)

(52) U.S. Cl.
CPC ............ *H01L 31/18* (2013.01); *G02B 6/4298* (2013.01); *Y02E 10/52* (2013.01); *Y10T 29/49826* (2015.01); *Y10T 156/10* (2015.01)

(56) References Cited

U.S. PATENT DOCUMENTS

| | | | |
|---|---|---|---|
| 7,873,257 B2 | 1/2011 | Morgan | |
| 7,906,722 B2 | 3/2011 | Fork et al. | |
| 8,210,164 B2 | 7/2012 | Herniak | |
| 2003/0075213 A1* | 4/2003 | Chen ................... | H01L 31/0547 136/246 |
| 2006/0191566 A1* | 8/2006 | Schaafsma .......... | H01L 31/0547 136/246 |
| 2007/0256726 A1 | 11/2007 | Fork et al. | |
| 2008/0047605 A1 | 2/2008 | Benitez et al. | |
| 2008/0087323 A1 | 4/2008 | Araki et al. | |
| 2008/0245401 A1 | 10/2008 | Winston et al. | |
| 2009/0002834 A1 | 1/2009 | Lissotschenko et al. | |
| 2009/0032102 A1* | 2/2009 | Chen ........................ | G02B 6/32 136/259 |
| 2009/0114280 A1* | 5/2009 | Jensen ..................... | F24S 23/00 136/259 |
| 2009/0133741 A1* | 5/2009 | Higuchi ............... | H01G 9/2068 136/252 |
| 2010/0012171 A1 | 1/2010 | Ammar | |
| 2010/0319773 A1 | 12/2010 | West et al. | |
| 2012/0037207 A1 | 2/2012 | Mimura et al. | |
| 2012/0266935 A1 | 10/2012 | Haight et al. | |
| 2013/0294066 A1* | 11/2013 | Nlina Lillelund ... | G02B 6/0008 362/232 |

OTHER PUBLICATIONS

Fu, L., et al. "Secondary Optics for Fresnel Lens Solar Concentrators" Nonimaging Optics: Efficient Design for Illumination and Solar Concentration VII. Aug. 2010. pp. 1-6.

Zamora, P., et al. "High Performance Fresnel-Based Photovoltaic Concentrator" Nonimaging Optics: Efficient Design for Illumination and Solar Concentration VII. Aug. 2010. pp. 1-8.

Patent Cooperation Treaty. "Notification of Transmittal of the International Search Report and the Written Opinion of the International Searching Authority, or the Declaration" Issued for PCT Application No. PCT/ US2013/073608 dated Apr. 18, 2014. (11 Pages).

* cited by examiner

SECONDARY OPTIC FOR CONCENTRATING PHOTOVOLTAIC DEVICE

BACKGROUND

1. Technical Field

The present invention relates to secondary optics for photovoltaic devices, and more particularly to solar concentrators to homogenize an optical spectrum and intensity of incident solar radiation imaged into a light pipe.

2. Description of the Related Art

Solar concentrators operate by focusing the light on a photovoltaic cell. Employing optical devices to concentrate the light on the photovoltaic cell enables the concentrator to operate at high power density levels. A Concentrator Photo-Voltaic (CPV) system employs an efficient photovoltaic element to convert concentrated incident light energy to electricity. Some CPV systems employ a triple junction photovoltaic cell and receiver to accomplish this conversion. The cell converts the wavelength spectrum of the sun in three wavelength regions of the cell. Each region of the spectrum is absorbed in a selected semiconductor material that efficiently converts the optical power in that spectrum region into electrical power.

Efficient CPV systems often use two concentration elements for most efficient light concentration, primary and secondary. The primary element typically comprises one of a Fresnel lens and a focusing mirror. The primary element collects the sun light and focuses the light onto an image in the secondary optic through which the light travels to the photovoltaic cell. The secondary optic may include a light pipe. A light pipe (or light prism) includes a solid piece of glass having surfaces with smooth optical quality finishes, also referred to as a non-imaging optical element. The light pipe further concentrates the imaged light from the primary optic onto an area precisely matching the area of the cell. However, conventional simple light prisms commonly used in the industry are not optimal in uniformity of intensity and homogeneity of spectral content.

SUMMARY

A light concentrating optic for use with a photovoltaic device includes a light pipe having a first end portion for receiving light and a second end portion for outputting concentrated light. An optical element is coupled to the light pipe on the first end portion and configured to form an optical interface between the light pipe and the optical element. The optical element includes at least one light transmitting surface configured to redirect incident light entering the optical element to disperse the light to fall incident on side walls of the light pipe to increase homogeneity and intensity of light through the second end portion.

Another light concentrating optic for use with a photovoltaic device includes a faceted light pipe having a first end portion for receiving light and a second end portion for outputting concentrated light. An optical element has at least one light transmitting surface configured to redirect incident light entering the optical element to disperse the light to fall incident on side walls of the light pipe to increase homogeneity and intensity of light through the second end portion. A transmissive interface medium is configured to couple light from the optical element to the light pipe. The transmissive interface is also configured to permit transmission of light between the optical element and the light pipe to form an optically diffusive interface therebetween.

A method for fabricating a light concentrating optic includes mounting an optical element on a first end portion of a light pipe for receiving light, with a second end portion of the light pipe for outputting concentrated light; and bonding the optical element to the light pipe on the first end portion with a transmissive medium to form an optically transmissive interface between the light pipe and the optical element, the optical element having at least one light transmitting surface configured to redirect incident light entering the optical element to disperse the light to fall incident on side walls of the light pipe to increase homogeneity and intensity of light through the second end portion.

Another method for concentrating light for a photovoltaic device includes molding an optical element to form at least one light transmitting surface configured to redirect incident light entering the optical element; mounting the optical element on a first end portion of a light pipe, the first end portion for receiving light, and a second end portion of the light pipe for outputting concentrated light; and forming an optically transmissive interface between the optical element and the light pipe by employing a transmissive medium between the light pipe and the optical element, such that light redirected by the optical element falls incident on side walls of the light pipe to increase homogeneity and intensity of light through the second end portion.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
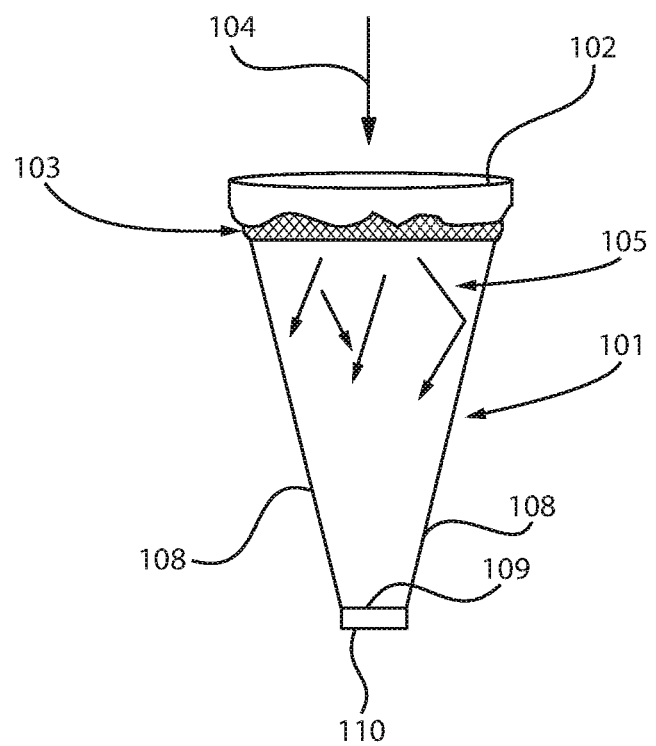
FIG. 1 is a diagram illustrating an improved secondary optic using a diffusive element, in accordance with one embodiment.

In accordance with the present principles, an improved light pipe device for solar applications is provided that combines diffusive and/or diffractive structures with concentrating light pipes. A secondary optic is located at an entrance surface of a light pipe or directly molded into the light pipe to improve spatial and spectral homogenization and uniformity of light transmitted to a photovoltaic cell. The present principles may be employed in many light or radiation directing applications and are particularly useful when employed with Concentrator Photo-Voltaic (CPV) systems.

Methods, systems and devices, in accordance with the present principles, provide light pipe improvements to more efficiently homogenize an optical spectrum and intensity of incident solar radiation imaged into the light pipe. The homogenized and intensified light is transmitted to a photovoltaic cell with a negligible loss of power by incorporating and attaching at least one of a convex lens, a diffuser, a combination of a convex lens and a diffuser, etc. to the top of the light pipe using an almost transparent material interface. It should be understood that a number of different light refracting, reflecting and redirecting structures or combinations thereof may be employed in accordance with the present principles.

A common form of light pipe used in solar concentrators comprises a glass hexahedron wherein a top and bottom surfaces are parallel and include orthogonal square surfaces. Light enters the top surface and exits the bottom surface. The top surface comprises a square area that is greater than or equal to the bottom surface. The side surfaces comprise four isosceles trapezoids. In accordance with the present principles, light is transmitted through the top surface and the bottom surface with minimal reflective losses. It is intended that light within the light pipe that is incident on side surfaces be reflected by the side surfaces efficiently via total internal reflection. Alternate embodiments apply reflective coatings to the side surfaces and antireflective coatings to the top and/or bottom surfaces. An alternate embodiment comprises a light pipe comprised of mirrored sides only and is referred to as a light cup. Alternate embodiments of the solid light pipe comprise materials including at least one of plastic, quartz, and sapphire. However, conventional light pipes are subject to imaging artifacts leading to nonhomogeneous light intensity and spectral content at the photovoltaic surface. The present principles eliminate a significant amount of this problem by modifying the incident light by providing an optic element or modification to the entrance surface of a conventional light pipe.

To improve light homogeneity on a conventional hexahedral prism type light pipe (or other faceted structure), the provided optic homogenizes three spectral regions. Spatial homogeneity is an important aspect because each area of the cell needs to be illuminated equally by the solar rays in the three spectral regions to have a most efficient power conversion. In one embodiment, a relatively short light pipe may have affixed to the top thereof one of a convex lens, a diffuser or a combination of a convex lens and a diffuser. The incorporation of such optics causes light incident on the entrance surface to undergo an increased number of internal reflections within the media, which helps randomize the three optical intensities over the cell area and thereby homogenize the three spectral regions. In the case of solar applications, the three spectral regions may include wavelengths between 350 and 660 nm, between 660 and 860 nm, and between 860 and 1600 nm.

A further benefit to the additional optics includes enhancing an acceptance angle of the optic. The solar concentrating system can accept incident sunlight from a larger range of off axis angles, which provides the system with larger error tolerance in directing the concentrator at the sun.

It is to be understood that the present invention will be described in terms of a given illustrative architecture having optical components and arrangements for photovoltaic systems; however, other architectures, structures, materials and process features and steps may be varied within the scope of the present invention.

It will also be understood that when an element such as a component or region is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. Methods as described herein may be used in the fabrication of photovoltaic devices. The devices may be integrated with other chips, discrete circuit elements, and/or other signal processing devices as part of either (a) an intermediate product, such as a solar collection component, or (b) an end product, such as a solar collection system. The intermediate or end products can be any product that ranges from toys, energy collectors, solar devices, light sensitive devices and other applications including computer products or devices having a display, a keyboard or other input device, and a central processor. The photovoltaic devices described herein are particularly useful for solar cells or panels employed to provide power for power utilities as well as for electronic devices, homes, buildings, vehicles, etc.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a light focusing system 100 is shown in accordance with one illustrative embodiment. The system 100 includes a light pipe 101 and a diffuser 102, which is affixed to the light pipe 101 by an interface material 103. The light pipe 101 may include a conventional light pipe modified in accordance with the present principles. The light pipe 101 includes an optical index of refraction, n1. The diffuser 102 includes an optical index of refraction, n2. The interface medium 103 includes an optical index of refraction, n3. The optical indices of these components, respectively, n1, n2, n3, are chosen to be close in value, e.g., within about 10% of each other. Also, n2 and n3 may have different values to permit diffusion of light at an interface between the diffuser 102 and the interface material 103. Values for the indices may be between about 1.3 and about 1.5, although other index values are also contemplated. In a particularly useful embodiment, the indices have a difference of between 0.1 and 0.01. In one embodiment, the interface material 103 provides adhesion between diffuser 102 and light pipe 101.

The diffuser 102 serves to spread focused and incident light 104 by adding a random directional component to the light 104. This can occur within the diffuser 102, but more generally, at one of the surfaces of the diffuser 102, which has been configured to be non-flat. An angle of the diffuser's surface preferably changes locally. By design, a range of local surface angles can be chosen to vary between zero for a flat local surface area to a maximum steep local angle, e.g., between about 10 to 60 degrees.

As a result of diffusion, many light rays are forced to reflect off sides 108 of the light pipe 101 before reaching an exit surface 109 at the bottom end of the light pipe 101. This mixes and randomizes the rays of diffused light 105 thereby homogenizing the light intensities over the exit surface 109 of the light pipe 101. In one embodiment, the sides or sidewalls 108 include a reflective material, such as a paint or a metal, e.g., Cr, Al, Ag, etc. Antireflective coatings may be applied to a top and/or bottom surface of the light pipe or any other surface of the system 100 or other systems described herein.

A photovoltaic device 110 is placed or mounted adjacent to the exit surface 109 to receive the homogenized and intensified light from the light pipe 101. The photovoltaic device 110 may include any type of solar cell or light sensitive device, including single-junction cells, multi-cell junction (tandem) cells, etc. The junctions as employed here refer to semiconductor junctions.

The improvement in homogeneity is a function of the optical indices n1 to n3 and of the diffuser angles. Shallow angles (e.g., 10 to 30 degrees) lead to lower homogenization and an improvement of a few percent in cell output. However, large angles (e.g., 45 to 60 degrees) increase homogenization, but lead to light escaping from the secondary optics when the rays are too steep to undergo total internal reflection. For each design in accordance with the present principles, there are optimal values of optical indices n1 to n3 and of diffuser angles that maximize homogenization without substantial light leakage. These values may be determined experimentally and/or using optical ray tracing computer modeling.

Figure 2:
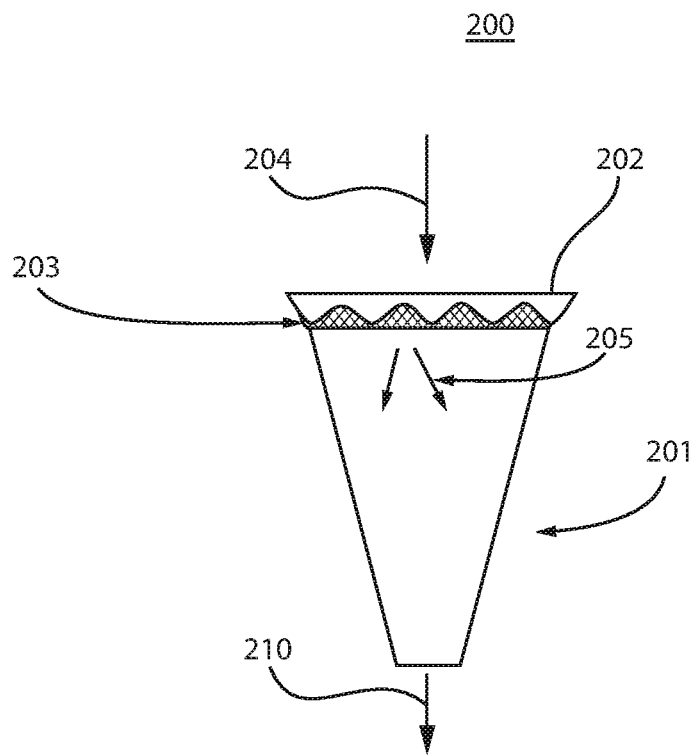
FIG. 2 is a diagram illustrating an improved secondary optic using a uniform array element, in accordance with one embodiment.

Referring to FIG. 2, another light focusing system 200 is illustratively shown. The system 200 includes a light pipe 201, a diffuser 202 and an interface medium 203 disposed therebetween. The light pipe 201 may include a conventional light pipe modified in accordance with the present principles. As before, the light pipe 201 includes an optical index of refraction, n1. The diffuser 202 includes an optical index of refraction, n2. The interface medium 203 includes an optical index of refraction, n3. The optical indices of these components, respectively, n1, n2, n3, are chosen to be close in value, e.g., within about 10% of each other. Also, n2 and n3 may have different values to permit diffusion of light at an interface between the diffuser 202 and the interface material 203. Values for the indices may be between about 1.3 and about 1.5, although other index values are also contemplated. In a particularly useful embodiment, the indices have a difference of between 0.1 and 0.01. In one embodiment the interface material 203 provides adhesion between diffuser 202 and light pipe 201.

The diffuser 202 includes a more uniform structure than the diffuser 102 of FIG. 1. In one embodiment, the diffuser 202 comprises a lenslet array sheet or a holographic surface wherein each small lens or surface spreads the light into the light pipe 201. An output beam 210 is a superposition of many smaller beams either directly or indirectly of diffused light 205. For this purpose, the ideal lenslet array is devoid of sharp corner features that diffuse incident light 204 in all directions.

While the diffuser 202 may include a lenslet array and/or a holographic surface, the diffuser may also include a linear or non-linear wavy surface. The lenslet array, or linear/non-linear wavy surface may be formed from an embossed plastic material. In other embodiments, the diffuser may include a diffractive structure, which may include grating lines or slits or include one or more convex lenses. In other embodiments, combinations of elements may be employed, e.g., a combination of convex lenses and wavy surfaces, etc.

Figure 3:
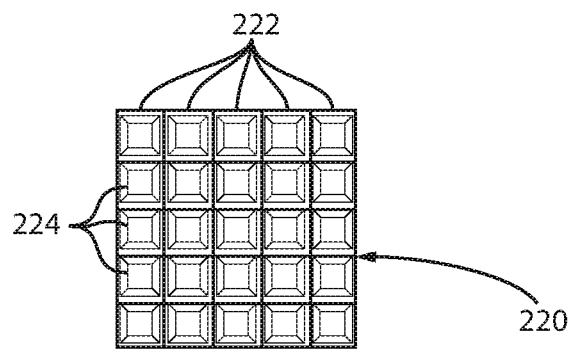
FIG. 3 is a top view of a lenslet array which may be employed in the structure of FIG. 2 in accordance with one embodiment.

Referring to FIG. 3, an illustrative top view of an illustrative lenslet array 220 for use as a diffuser 202 is illustratively shown. The array 220 is comprised of smooth sinusoidal or faceted surfaces 224 for each small lens 222. The lenses 222 spread light into the light pipe 201 and diffuse the light in cones with angles, e.g., between about 10 and 60 degrees.

Figure 4:
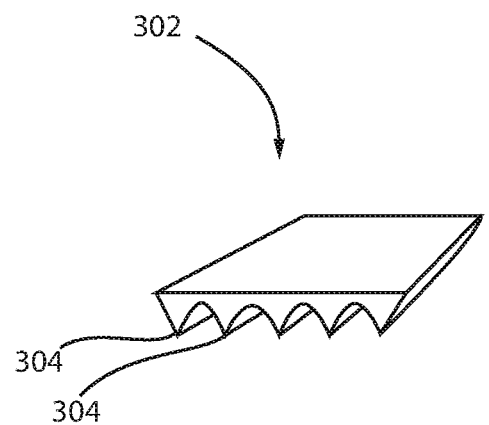
FIG. 4 is a top view of a linear diffuser which may be employed in the structure of FIG. 2 in accordance with one embodiment.

Referring to FIG. 4 with continued reference to FIG. 2, an illustrative top view of a linear diffuser 302 for use as a diffuser 202 is illustratively shown. The linear diffuser 302 includes wave-like structured lines 304. When attaching the diffuser 220 to the light pipe 201 using the transparent/transmissive interface 203, the lines 304 of the linear diffuser need to be perpendicular to sun movement. This will spread the light 204 forming lines of refracted light (diffused light 205) which will then be reflected off the sides of the light pipe 201 towards the exit end as a homogenized beam. In the embodiment depicted in FIG. 4, an advantage is provided primarily in a single axis of tilt. It should be understood that a second axis of tilt can also be accommodated by providing additional lines perpendicular to the sun's movement in a second tilt axis.

Figure 5:
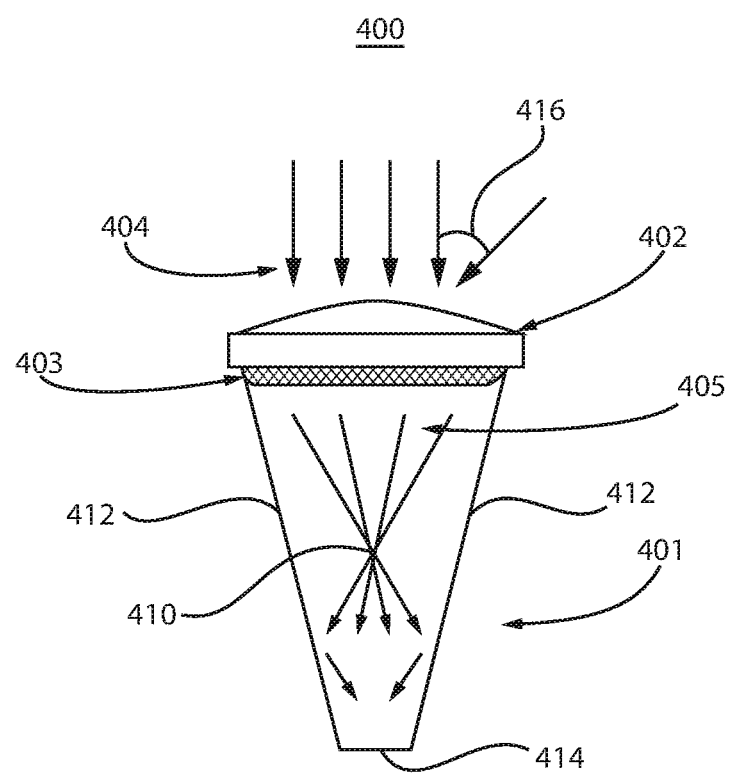
FIG. 5 is a diagram illustrating an improved secondary optic utilizing a plano convex element in accordance with one embodiment.

Referring to FIG. 5, another light focusing system 400 is illustratively shown. The system 400 includes a light pipe 401, a lens 402 and an interface medium 403 disposed therebetween. The light pipe 401 may include a conventional light pipe modified in accordance with the present principles. As before, the light pipe 401 includes an optical index of refraction, n1. The lens 402 includes an optical index of refraction, n2. The interface medium 403 includes an optical index of refraction, n3. The optical indices of these components, respectively, n1, n2, n3, are chosen to be close in value, e.g., within about 10% of each other. Values for the indices may be between about 1.3 and about 1.5, although other index values are also contemplated. In a particularly useful embodiment, the indices have a difference of between 0.1 and 0.01. In one embodiment the interface material 403 provides adhesion between lens 402 and light pipe 401.

In one embodiment, the lens 402 includes a convex (convergent) lens, which is affixed to the light pipe 401, using the interface material 403. The lens 402 further bends rays of incident light 404 at angles as re-imaged light 405, which meets at a central region 410, or a small focal image, and then spreads to be reflected off sides 412 of the light pipe 401. The lens 402 may include glass, a mineral, a plastic or other suitable light transmissive material. The lens 402 may also include a multi-element lens. The convex lens 402 may include, e.g., a spherical profile, an aspheric profile, a parabolic profile, etc. In one embodiment, lens 402 may include a doublet structure.

By employing the lens 402 (and/or the diffusers of the other embodiments), the angular content of rays entering the light pipe 401 is increased. Note that in a concentrating light pipe or light guide, there is a limit to the amount of angle relative to a central axis that can be useful. In the case of light pipes that reflect light incident on the side walls by total internal reflection, the incident angle needs to be restricted to below the critical angle relative to the side surface (412). The critical angle is determined by the materials of the light pipe 401 and its surroundings. Above the critical angle, efficiency is lost due to light leakage out of the sides. Another consideration in concentrating light pipes with mirrored side walls is that if the angle relative to a tapered side (412) exceeds 90 degrees, the light will retro reflect out of the top of the light pipe. This restriction also limits the taper angle of the light pipe and its length.

In one embodiment, for a system optimized for 1600 times concentration, the lens 402 is optimal at approximately a 40 mm focal length. The beam at an exit face 414 is further randomized and homogenized due to the increase in angular content, and an increased number of reflections against the sides 412. A further advantage of the embodiments shown for the convex lens 402 includes an improvement to an acceptance angle 416 of the light pipe 401. In this way, incident light 404 may be received from wider angles. Note that the acceptance angle (416) may be increased for all embodiments in accordance with the present principles.

System 400 (or other systems as described herein) may be produced by molding a convex surface, etc. comprising optical plastic or liquid glass directly on a light pipe surface. For example, a liquid glass or plastic heated above the liquid transition temperature may be poured in a suitably designed mold, having a semi-spherical or convex shape. Instead of attaching a convex lens, a molded light pipe is more reliable, sustainable and eliminates an interface (403). Alternately, the optic (lens) may include other moldable or curable materials such as, e.g., at least one of a plastic, a thermoplastic, a UV cured plastic, a catalyst cured plastic, a glass, etc. The light pipe 401 or lens 402 may provide a light transmitting surface such as a convex shape using, e.g., a compression molding technique, injection molded technique, etc. The molded materials may include fluoropolymer, acrylic, epoxy, silicone, etc.

It should be understood that this and other embodiments may be formed as a unitary device including all components in a same monolithic component. For example, the light pipe 401 and the convex lens 402 may be formed in a same molding process. In addition, a light pipe may be modified to include a diffuser structure thereon by a machining or other process.

Figure 6:
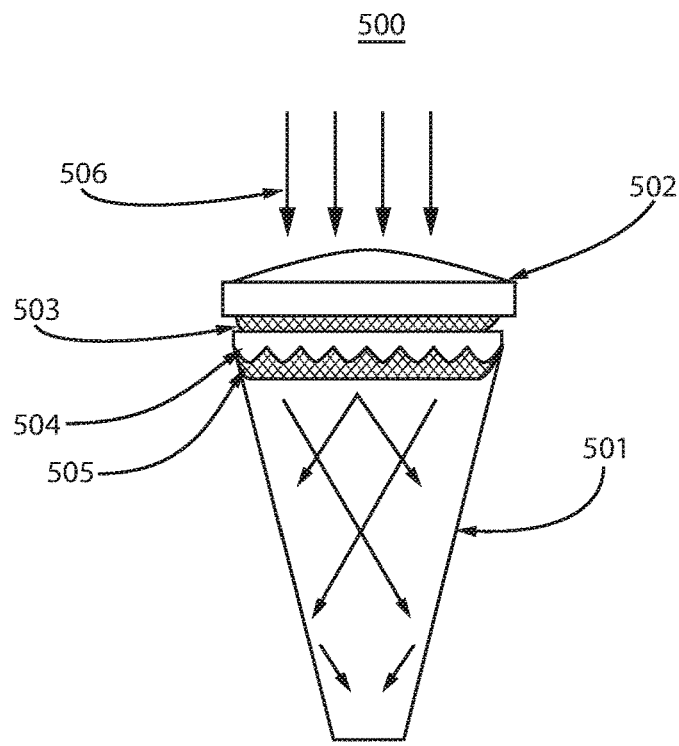
FIG. 6 is a diagram illustrating an improved secondary optic utilizing a plano convex element and a diffusive element in accordance with one embodiment.

Referring to FIG. 6, in another embodiment, a focusing system 500 includes a combination of a convex lens 502 and a diffuser 504 affixed to each other and a light pipe 501 using interface materials 503 and 505. This combination gives more optimum randomization and homogenization for incident light 506 as well as enhancing the acceptance angle.

The light pipe 501 may include a conventional light pipe modified in accordance with the present principles. The light pipe 501 includes an optical index of refraction, n1. The lens 502 includes an optical index of refraction, n2. The interface medium 503 includes an optical index of refraction, n3. The diffuser 504 includes an optical index of refraction, n4. The interface medium 505 includes an optical index of refraction, n5. The optical indices of these components, respectively, n1, n2, n3, n4, n5 are chosen to be close in value, e.g., within about 10% of each other. Values for the indices may be between about 1.3 and about 1.5, although other index values are also contemplated. In a particularly useful embodiment, the indices have a difference of between 0.1 and 0.01. In one embodiment the interface materials 503 and 505 provide adhesion between lens 502, diffuser 504 and light pipe 501.

It should be understood that the diffuser 504 may include uniform or non-uniform surfaces for diffusing incident light. For example, the diffuser 504 may include lenslets, linear diffuser, sinusoidal shapes, varying surfaces, etc. The interface medium 503 and/or 505 may include a same material. Likewise, the optical element (diffuser lens, etc.) may include a same material as the light pipe and even as the interface medium, which may include, e.g., a substantially transparent adhesive, an index matching fluid, an acrylic, an epoxy, a silicone, Krytox™ grease, etc.

Figure 7:
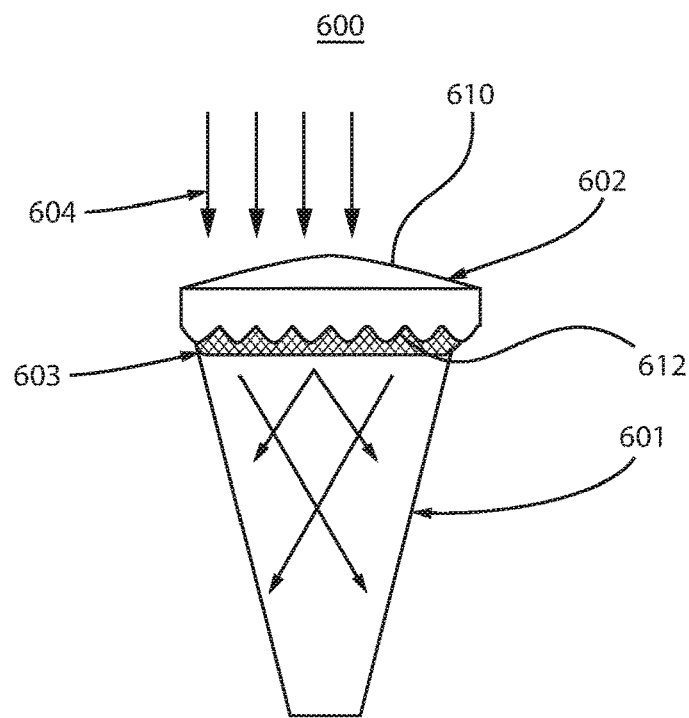
FIG. 7 is a diagram illustrating an improved secondary optic utilizing a plano convex element and a diffusive element integrally formed together in accordance with one embodiment.

Referring to FIG. 7, in a focusing system 600, a combination optical element 602 includes a convex lens and a diffusing surface in a single element. The element 602 includes a convex top surface 610, and a diffusing bottom surface 612. The diffusing bottom surface 612 may include at least one of a diffuser, a lenslet array, a linear diffuser, etc. Advantages of this design are simplicity and cost, particularly since element 602 can be mass produced by cost-effective processes such as molding.

The element 602 is affixed to a light pipe 601 using interface materials 603. The light pipe 601 may include a conventional light pipe modified in accordance with the present principles. The indexes of refraction are similar as described with reference to FIG. 5. A plano convex lens profile (e.g., for lenses 402, 502 and element 602) includes but is not limited to at least one of a spherical profile and a parabolic profile.

Embodiments described herein may be fabricated by combining the light pipe (101, 201, 401, 501, 601) with another optical apparatus (e.g., 102, 202, 402, 502, 602) through an interface (e.g., 103, 203, 403, 503, 603). In one embodiment, the interface is transparent or nearly transparent (transmissive). In other embodiments, the interface provides some diffusion of light passing through it. The interfaces described herein may include a silicon adhesive. In another embodiment, the transparent interface may include Krytox™ grease. Other adhesives or materials may also be employed. For example, interface materials in the present embodiments include but are not limited to at least one of an optical adhesive, an index matching fluid, an epoxy based compound, a silicone based compound, an acrylic based compound, etc. One consideration in selecting an optical interface material is to efficiently couple light from one section of the optic to the next. Index matching for transparency may also be implemented.

Figure 8:
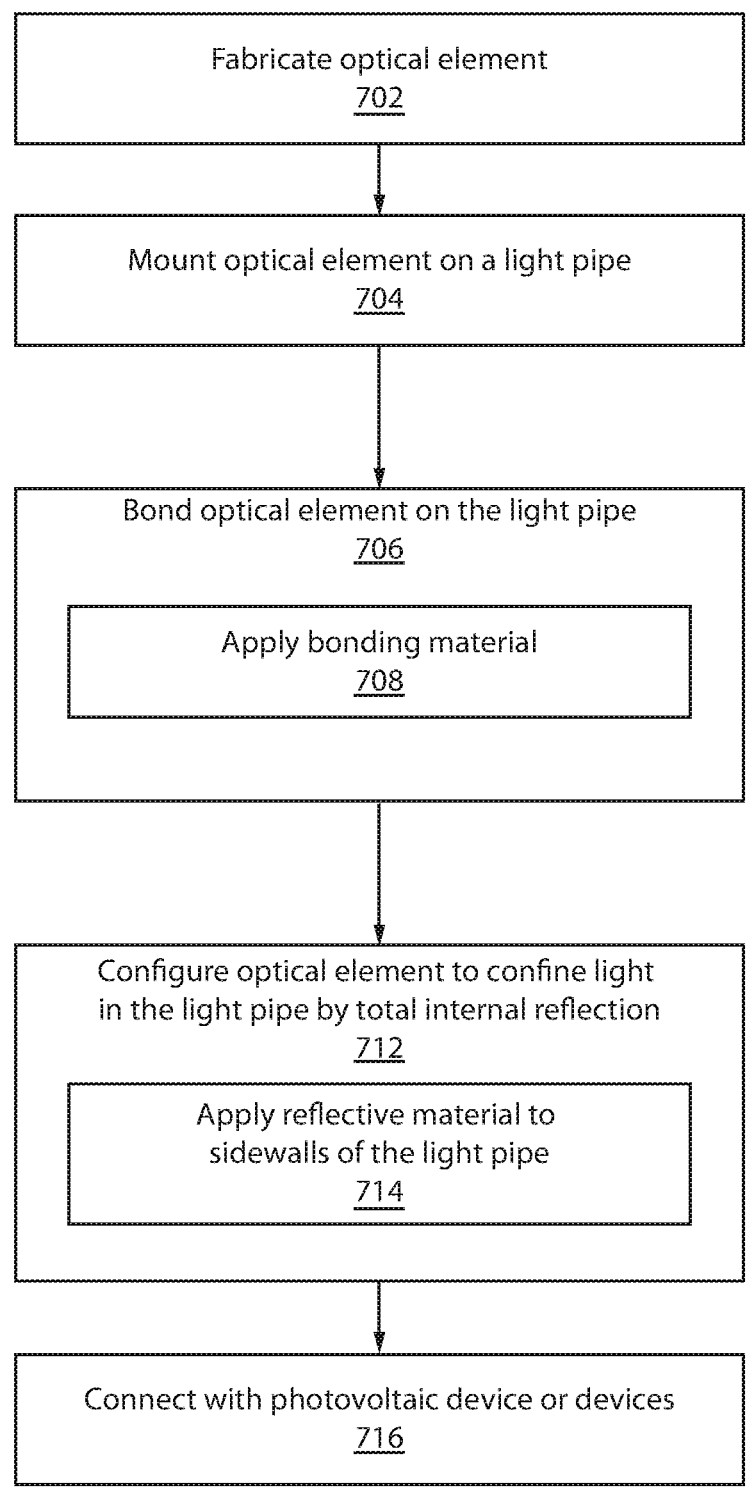
FIG. 8 is a block/flow diagram showing methods for fabricating a light concentrating optic in accordance with illustrative embodiments.

Referring to FIG. 8, methods for concentrating light are illustratively shown in accordance with the present principles. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 702, an optical element is fabricated or configured. The optical element may be formed on a conventional light pipe by machining a lens or diffuser in a light receiving end. The optical element may be molded using a molding technique such as injection molding, compression molding or other molding process. The optical element may be configured with one or more transmission surfaces, which may include lenses, arrays of shapes, etc. The light transmitting surface may include at least one of a light diffusive surface, a light diffusive pattern, a light diffractive or a light refractive structure, at least one of a lenslet array, a holographic surface, a linear diffuser, non-linear wavy surface, a convex lens, or any combination thereof. For example, the optical element may include a convex lens integrally molded with a diffuser.

In block 704, if the optical element is separate from the light pipe, the optical element, formed by whatever method, is mounted on a first end portion of a light pipe for receiving light. A second end portion of the light pipe outputs concentrated light. The light pipe may include a number of geometric configurations including a hexahedral, a conical shape, a cylindrical shape, or other prisms or magnification geometry.

The optical element includes the at least one light transmitting surface, which is configured to redirect incident light entering the optical element by dispersing the light to fall incident on side walls of the light pipe to increase homogeneity and intensity of light through the second end portion.

In block 706, the optical element is bonded to the light pipe on the first end portion in one embodiment. In block 708, bonding may include applying at least one of an acrylic, an epoxy, a silicone or grease, although other materials are also contemplated. The bonding may include using an index matched transmissive medium to form an optically transparent interface between the light pipe and the optical element. In other embodiments, differences between the optical indexes of the light pipe and the interface material (or other components) are employed to help diffusion. In one embodiment, the optical element, optical interface material and the light pipe include different optical indices within a range of 0.01 to 0.1 of each other.

In block 712, the optical element is configured to confine incident light within the light pipe by total internal reflection from the sidewalls. In block 714, the sidewalls of the light pipe may be coated with a reflective material to improve internal reflections.

In block 716, the second end portion of the light pipe is affixed to or held adjacent to a photovoltaic device. The light pipe concentrates the light received to homogenously apply the intensified light across the photovoltaic device. A plurality of optical elements, light pipes and photovoltaic devices may be arranged in an array or other configuration for converting radiation into electrical energy.

Having described preferred embodiments of a secondary optic for concentrating solar photovoltaic (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A light concentrating optic configured for use with a photovoltaic device, comprising:
    a light pipe having a first end portion for receiving light and a second end portion for outputting concentrated light;
    a first optical interface material being an adhesive configured to provide adhesion between an optical element and the light pipe, the adhesive extending circumferentially along the light pipe;
    the optical element configured to form an optical interface between the light pipe and the optical element, the optical element having at least one light transmitting surface facing toward the first end portion of the light pipe that is configured to redirect incident light entering the optical element to disperse the light to fall incident on side walls of the light pipe to increase homogeneity and intensity of light through the second end portion; and
    a convex lens affixed to the optical element by a second optical interface material, wherein the second optical interface material has a different index of refraction than the first optical interface material.

2. The optic as recited in claim 1, wherein the at least one light transmitting surface with at least one of a light diffusive surface or light diffusive pattern.

3. The optic as recited in claim 1, wherein the optical interface includes at least one light transmitting surface that includes at least one of a light diffractive or a light refractive structure.

4. The optic as recited in claim 1, wherein the light pipe has an index of refraction different than the index of refraction of both the first and second optical interface materials.

5. The optic as recited in claim 1, wherein the optical element has an index of refraction different than the index of refraction of both the first and second optical interface materials.

6. The optic as recited in claim 1, wherein the optical element is configured to confine incident light within the light pipe by total internal reflection from the sidewalls.

7. The optic as recited in claim 1, wherein light entering the light pipe is confined by means of reflection from the side walls that are coated with a reflective material.

8. The optic as recited in claim 1, wherein the optical element includes at least one of a lenslet array, a holographic surface, a linear diffuser, non-linear wavy surface, a convex lens, or a combination thereof.

9. The optic as recited in claim 1, wherein the optical element includes a convex lens integrally formed with a diffuser.

10. The optic as recited in claim 1, wherein the first optical interface material includes a silicon adhesive and the second optical interface material includes an index matching fluid.

11. A light concentrating optic configured for use with a photovoltaic device, comprising:
    a faceted light pipe having a first end portion for receiving light and a second end portion for outputting concentrated light;

a first transmissive interface medium being an adhesive configured to provide adhesion between an optical element and the light pipe, the adhesive extending circumferentially along the faceted light pipe and the first transmissive interface medium being configured to permit transmission of light between the optical element and the light pipe to form an optically diffusive interface therebetween;

the optical element having at least one light transmitting surface facing toward the first end portion of the light pipe configured to redirect incident light entering the optical element to disperse the light to fall incident on side walls of the light pipe to increase homogeneity and intensity of light through the second end portion; and a convex lens affixed to the optical element by a second transmissive interface medium, wherein the second transmissive interface medium has a different index of refraction than the first transmissive interface medium.

12. The optic as recited in claim 11, wherein the light pipe has an index of refraction different than the index of refraction of both the first and second transmissive interface mediums.

13. The optic as recited in claim 11, wherein the first transmissive interface medium includes a silicon adhesive and the second transmissive interface medium includes an index matching fluid.

* * * * *